United States Patent [19]

Kageyama et al.

[11] Patent Number: 5,504,690
[45] Date of Patent: Apr. 2, 1996

[54] AUTOMATIC LOGIC DESIGNING METHOD AND SYSTEM

[75] Inventors: Naohiro Kageyama, Hachioji; Toru Shonai; Rikako Suzuki, both of Kodaira; Takashi Okada, Yokohama; Kazuhiko Iijima, Ebina; Hiroyuki Nakajima, Isehara; Chihei Miura, Kanagawa; Tsuguo Shimizu, Sayama, all of Japan

[73] Assignee: Hitachi, Ltd., Tokyo, Japan

[21] Appl. No.: 108,044

[22] Filed: Aug. 16, 1993

[30] Foreign Application Priority Data

Aug. 20, 1992 [JP] Japan ..................... 4-221226

[51] Int. Cl.$^6$ .................................................. G06F 17/50
[52] U.S. Cl. ............................................ 364/489; 364/488
[58] Field of Search ...................... 364/488, 489, 364/490, 491

[56] References Cited

U.S. PATENT DOCUMENTS

| | | | |
|---|---|---|---|
| 4,703,435 | 10/1987 | Darringer et al. | 364/489 |
| 5,005,136 | 4/1991 | Van Berkel et al. | 364/490 |
| 5,029,102 | 7/1991 | Drumm et al. | 364/489 |
| 5,258,919 | 11/1993 | Yamanouchi et al. | 364/489 |
| 5,274,793 | 12/1993 | Kuroda et al. | 395/500 |
| 5,287,289 | 2/1994 | Kageyama et al. | 364/489 |
| 5,299,137 | 3/1994 | Kingsley | 364/489 |
| 5,331,569 | 7/1994 | Iijima | 364/489 |
| 5,359,537 | 10/1994 | Saucier et al. | 364/489 |

FOREIGN PATENT DOCUMENTS

| | | |
|---|---|---|
| 91243 | 4/1989 | Japan . |
| 253476 | 10/1990 | Japan . |

OTHER PUBLICATIONS

"Table Driven System," Information Processing Society of Japan, The 29th National Conference, 1984, pp. 91-92. (Japanese).
Gregory, David, et al. "Socrates: A System for Automatically Synthesizing and Optimizing Combinational Logic," The Design Automation Conference, 1986, pp. 79-85. (English).
Rudell, Richard L., et al. "Multiple-Valued Minimization for PLA Optimization," IEEE Transactions on Computer-Aided Design, vol. CAD-6, No. 5, Sep. 1987, pp. 727-750. (English).

*Primary Examiner*—Vincent N. Trans
*Attorney, Agent, or Firm*—Fay, Sharpe, Beall, Fagan, Minnich & McKee

[57] ABSTRACT

An automatic logic designing method and system in which a control table describing a condition and a behavior corresponding to the condition which express the specification of a computer is inputted and processed in a processor so that a logic circuit having no redundancy which can be easily seen by the designer is designed at a high speed. The control table is converted into the logic circuit whose function is expressed by a detailed Boolean expression. In an instance, selector logics are allocated in consideration of the polarity of the logic. A redundancy detection process or a redundancy logic elimination process is executed for the redundancy logics designated by a redundancy indicate file. A signal name which can be easily understood by the logic designer is formed. An implementing system includes an input control table file, a functional structure converting section of a conditional equation and a behavioral structure, a regular logic expanding processing section, and a redundancy logic elimination processing section, so that the logic circuit formed is outputted to a Boolean expression file.

13 Claims, 16 Drawing Sheets

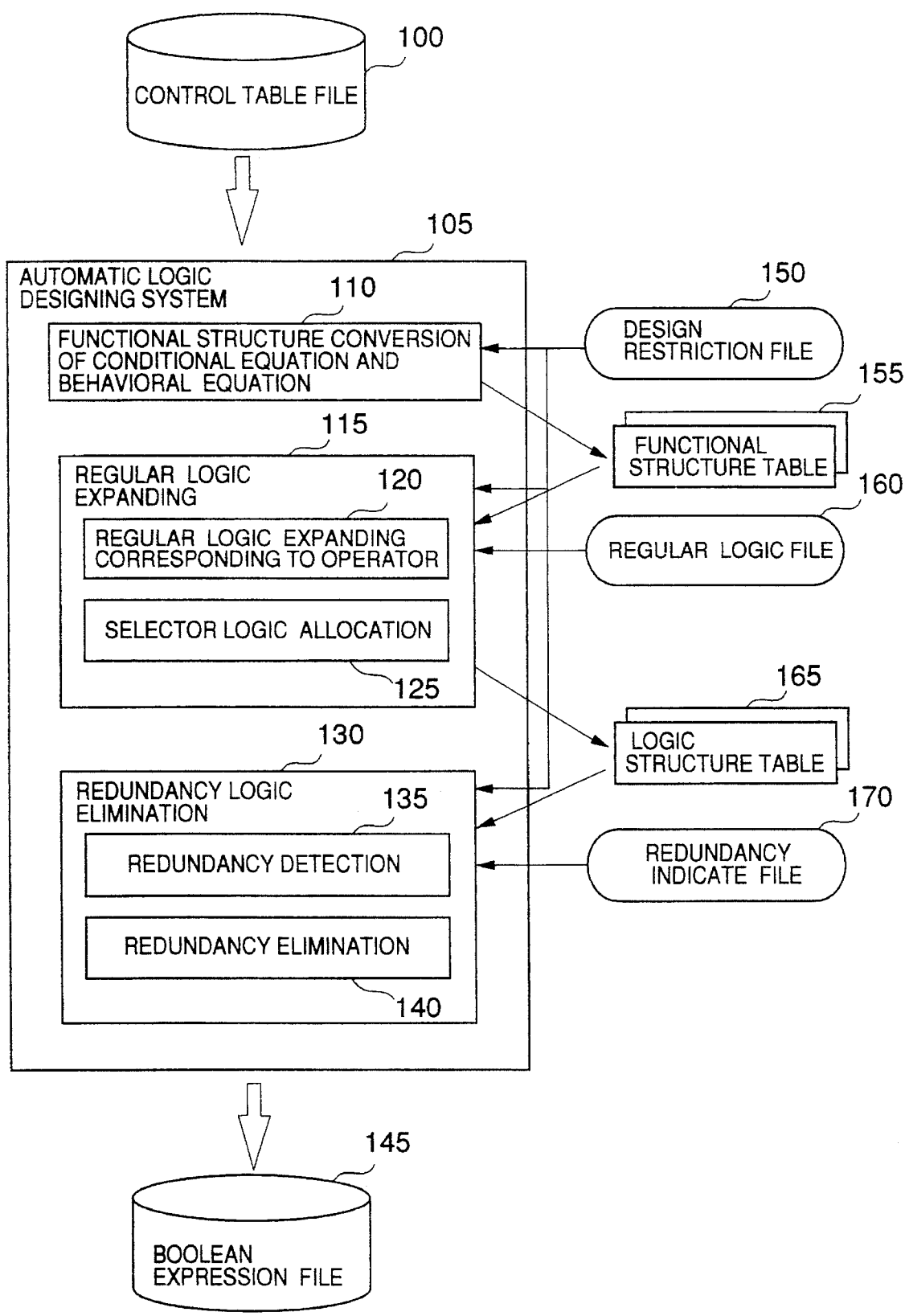

FIG. 2A

| IF CONDITIONAL DESCRIPTION | THEN BEHAVIORAL DESCRIPTION |
|---|---|
| IR<0-1>=0 | INC<0-8>=IFX<0-8>+2 |
| IR<0-1>=1 | INC<0-8>=IFX<0-8>+4 |
| IR<0-1>=2 | INC<0-8>=IFX<0-8>+4 |
| IR<0-1>=3 | INC<0-8>=IFX<0-8>+6 |

FIG. 2B

| IF CONDITIONAL DESCRIPTION | | THEN BEHAVIORAL DESCRIPTION | |
|---|---|---|---|
| TA5 | TA6 | E<0-1> | E<2-3> |
| 0 | 0 | H<0-1> | H<2-3> |
| 0 | 1 | 1 | H<0-1>&B |
| 1 | 0 | 1 | 1 |
| 1 | 1 | 1 | 1 |

| ITEM NO. | NAME OF FUNCTIONAL ELEMENT | FUNCTION | INFORMATION OF INPUT SIGNAL TABLE FOR FUNCTIONAL STRUCTURE | | INFORMATION OF OUTPUT SIGNAL TABLE FOR FUNCTIONAL STRUCTURE | |
|---|---|---|---|---|---|---|
| | | | POINTER | NUMBER OF ENTRIES | POINTER | NUMBER OF ENTRIES |
| 1 | M00 | INPUT | 1 | 1 | – | – |
| 2 | M01 | INPUT | 2 | 1 | – | – |
| 3 | M02 | INPUT | 3 | 1 | – | – |
| ⋮ | ⋮ | ⋮ | ⋮ | ⋮ | ⋮ | ⋮ |
| 13 | M12 | INPUT | 13 | 1 | – | – |
| 14 | M13 | + | 14 | 2 | 1 | 1 |
| 15 | M14 | SEL | – | – | 1 | 1 |
| 16 | M15 | = | – | – | – | – |
| ⋮ | ⋮ | ⋮ | ⋮ | ⋮ | ⋮ | ⋮ |
| 20 | M19 | OUTPUT | – | – | – | – |

| ITEM NO. | NAME OF INPUT SIGNAL FOR FUNCTIONAL STRUCTURE | FUNCTIONAL ELEMENT TABLE POINTER |
|---|---|---|
| 1 | IFX<0-8> | 0 |
| 2 | 2 | 0 |
| 3 | 4 | 0 |
| ⋮ | ⋮ | ⋮ |
| 13 | 3 | 0 |
| 14 | M00S | 1 |
| 15 | M14S | 15 |
| 16 | M01S | 2 |
| ⋮ | ⋮ | ⋮ |

| ITEM NO. | NAME OF OUTPUT SIGNAL FOR FUNCTIONAL STRUCTURE | FUNCTIONAL ELEMENT TABLE POINTER |
|---|---|---|
| 1 | M13S | 20 |
| 2 | M14S | 14 |
| ⋮ | ⋮ | ⋮ |
| 7 | INC<0-8> | 0 |

| ITEM NO. | NAME OF LOGIC ELEMENT | FUNCTION OF LOGIC ELEMENT | INFORMATION OF INPUT SIGNAL TABLE FOR LOGIC STRUCTURE | | INFORMATION OF OUTPUT SIGNAL TABLE FOR LOGIC STRUCTURE | | REDUNDANCY FLAG |
|---|---|---|---|---|---|---|---|
| | | | POINTER | NUMBER OF ENTRIES | POINTER | NUMBER OF ENTRIES | |
| 1 | M051 | INPUT | 1 | 1 | 1 | 1 | |
| 2 | M052 | INPUT | 2 | 1 | - | - | |
| 3 | M061 | INPUT | 3 | 1 | - | - | |
| 4 | M15I1 | ^M051S&^M061S!M051S&M061S | 4 | 2 | 2 | 1 | |
| 5 | M15I2 | ^M052S&^M062S!M052S&M062S | - | - | 3 | 1 | |
| 6 | M15 | M15I1S&M15I2S | 6 | 2 | - | - | |
| ... | ... | ... | ... | ... | ... | ... | ... |

| ITEM NO. | NAME OF INPUT SIGNAL FOR LOGIC STRUCTURE | LOGIC STRUCTURE TABLE POINTER |
|---|---|---|
| 1 | IR0 | 0 |
| 2 | IR1 | 0 |
| 3 | 0 | 0 |
| 4 | M05IS | 1 |
| 5 | M06IS | 3 |
| 6 | M15I1S | 4 |
| 7 | M15I2S | 5 |
| ⋮ | ⋮ | ⋮ |

Columns: 1000, 1010, 1020

| ITEM NO. | NAME OF OUTPUT SIGNAL FOR LOGIC STRUCTURE | LOGIC STRUCTURE TABLE POINTER | | | |
|---|---|---|---|---|---|
| 1 | M05IS | 4 | - | - | - |
| 2 | M15I1S | 6 | | | |
| 3 | M15I2S | 6 | | | |
| ⋮ | ⋮ | ⋮ | | | |

Columns: 1100, 1110, 1120

FIG. 13

| DESTINATION OF SIGNAL TRANSFER / SIGNAL SOURCE | M051 | M052 | M15 | M14 SEL23 | M18 | M14 | ... |
|---|---|---|---|---|---|---|---|
| M051 | | | 1 | 1 | 1 | | ... |
| M052 | | | 1 | 1 | 1 | | ... |
| M15 | | | | | | | ... |
| M14SEL23 | | | | | | 1 | ... |
| M18 | | | | | | 1 | ... |
| M14 | | | | | | | ... |
| : | : | : | : | : | : | : | |

FIG. 14

| DESTINATION OF SIGNAL TRANSFER / SIGNAL SOURCE | M051 | M052 | M15 | M14 SEL23 | M18 | M14 | ... |
|---|---|---|---|---|---|---|---|
| M051 | | | | | | 2 | ... |
| M052 | | | | | | 2 | ... |
| M15 | | | | | | | ... |
| M14SEL23 | | | | | | | ... |
| M18 | | | | | | | ... |
| M14 | | | | | | | ... |
| : | : | : | : | : | : | : | |

AUTOMATIC LOGIC DESIGNING METHOD AND SYSTEM

BACKGROUND OF THE INVENTION

The present invention relates to an automatic logic designing for performing a logic design of a digital logic system by a computer and, more particularly, to a designing method and system of forming a detailed logic circuit expressed by a Boolean expression on the basis of the behavioral description specification of a computer.

In association with the enlargement of a logic scale of a computer, an automatic logic designing method has conventionally been proposed for the purpose of automatization of the computer logic design. There has been proposed a method whereby a behavioral description is used to more simply describe the logic specification of a logic circuit of a large scale and a logic is formed from the behavioral description of the computer.

The behavioral description as an input of a conventional automatic logic designing system is described in a format similar to that of a software program in accordance with a predetermined language specification. For example, according to a format shown in FIG. 5 of JP-A-2-253476, "Logic Synthesis Method", a method of separately describing a conditional description and a behavioral description by using keywords IF and THEN is used. According to such a format, although the contents shown by the keywords IF and THEN can be freely described, it is difficult to understand the corresponding relation between the IF-conditional description and the THEN-behavioral description which are different.

On the other hand, in case of designing a logic of a computer by inputting data in a table format, a truth table is used. The truth table describes a logic value by partitioning the conditional portion and the behavioral portion by a partition line. In the designing of software, there is a decision table or the like which has been proposed in the thesis "Table Driven System" disclosed in the collection of theses of Information Processing Society of Japan, the 29th National Conference, pages 91 to 92, 1984. In the decision table, the conditions and the corresponding behavior are described by using delimiter characters without using any keyword.

In case of forming a multilevel logic from the above behavioral description, there is used a method whereby a behavior which is expressed by the behavioral description is realized by a plurality of regular logics which have been prepared and registered in a library and several regular logics in which the number of gates is small and the delay time is short are selected and combined, thereby forming a logic. Such a method is shown in JP-A-2-253476, "Logical Synthesizing Method" mentioned before.

In case of constructing the multilevel logic from the above behavioral description, a circuit in which the delay time is short and the number of gates is small can be realized by constructing the multilevel logic in consideration of the input polarity and output polarity of the gates constructing a logic circuit. For example, according to JP-A-64-91243, "Logic Gate Equivalent Converting Method", there has been proposed a method whereby by using a fact that a serial structure of an NAND gate and an inverter and a serial structure of an inverter and an NOR gate are equivalent, the inverter is moved in a logic circuit, and in the case where the inverters continuously appear, those inverters are deleted.

In case of using the conventional input description in the automatic logic designing system which realizes the above conventional automatic logic designing method, degrees of freedom on the description of the conditional description and behavioral description using the IF and THEN keywords are large. Therefore, it is difficult to correspond among different conditions. It is not easy to discriminate whether all of the conditions are satisfied or not. As the conditions and behaviors become complicated, the above obstacle becomes remarkable. On the other hand, since the contents of the description in the truth table are based on only the logic value of 0 or 1, the table size is large for the description of the complicated logic of a large scale and it is not easy to form such a truth table. In other words, according to the above conventional technique, an advanced table description which describes complicated conditions and behavior is difficult.

In case of forming a logic circuit on the basis of the above input description, on the other hand, when the conditional and behavioral equations are complicated, it is hard to obtain a logic circuit in which the number of gates and the delay time are set to the optimum values so long as the limited number of regular logics registered in the library. On the other hand, there has conventionally been used a method whereby a target logic circuit which has once been constructed by regular logics is developed into a two-level logic and is again synthesized to a multilevel logic. According to such a method, however, since a processing time increases with an increase in scale of the target logic, the conventional technique can be applied to only a logic of a small scale.

In the above conventional technique, the polarity upon formation of the multilevel logic has been considered for only a gate logic. However, a method of constructing a multilevel logic in which the polarity is considered is not yet proposed for a logic circuit having a more macro function whose abstraction degree is higher than that of a gate logic. With respect to a logic drawing corresponding to a design logic circuit, consideration has been made with respect to a good-looking about an arrangement and wirings of logic devices, no consideration is paid to the signal names which assist the understanding of the designed logic circuits.

SUMMARY OF THE INVENTION

It is an object of the invention to provide a logic designing method and system which allows a designer of a logic to easily describe a complicated logic specification and describe the specification so as to be easily understood.

Another object of the invention is to provide a method which can eliminate a redundancy logic at a high speed from the description of an input logic specification, or can eliminate a redundancy logic on the basis of an instruction of the logic designer as needed, and presents to the logic designer a logic drawing which is further easy to see.

To accomplish the above objects, an automatic logic designing method according to an aspect of the present invention comprises various processing steps or processes which are executed by using a computer: inputting a conditional description and a behavioral description of a table format; converting the above behavioral description into a functional structure which is a connecting structure of regular logics such as an adder, a comparator or the like in which their functions have been predetermined; performing a regular logic expanding process in order to convert the functional structure obtained by the functional structure conversion step into a more detailed logic circuit structure;

and eliminating redundancy portions among the expanded detailed logic circuit.

The behavioral description of the table format is a table description including: a description column of the set conditions of a signal; and a description column of the behavior of the corresponding logic circuit. The functional structure converting process is such that the conditional equation and behavioral equation described in the table are converted into a connecting structure called a functional structure composed of input and output terminals and regular logics whose functions have been predetermined and the connecting structure is expanded into a functional structure table.

The regular logic expanding process is a process such that the above functional structure which has been expanded in the functional structure table is inputted, as for the regular logic which exists in the functional structure and whose function has been predetermined, a logic circuit structure having a Boolean expression to realize such a function by a logic circuit and a connecting structure of the Boolean expression is allocated to such a regular logic, and the logic circuit structure is expanded into the logic structure table.

The redundancy logic eliminating process is a process such that the above logic circuit structure table is inputted and redundancy logics existing in the logic circuit structure are eliminated.

The above regular logic expanding process further includes: a regular logic expanding process corresponding to operators for allocating logic circuits that are expressed by detailed Boolean expressions to the operators described in the conditional equation and behavioral equation and for producing internal signals; and a selector logic allocating process for allocating a logic circuit that is expressed by the detailed Boolean expression to a selector logic and for forming an internal signal.

The redundancy logic eliminating process further comprises: a redundancy detecting process for detecting redundancy logics which occur in the multilevel logic; and a redundancy eliminating process for eliminating the detected redundancy logics. The redundancy logic eliminating process has a redundancy indicate file to store indication information of the redundancy logics by the logic designer. The redundancy detecting process further comprises an adjacent matrix forming process and a reconvergent area detecting process. The redundancy eliminating process further comprises a two-level logic construction, a two-level logic minimization, and a multilevel logic synthesis. The redundancy eliminating process eliminates a redundancy logic pointed out by the redundancy detecting process or the redundancy indicate file. The redundancy logic is eliminated in accordance with the order of the two-level logic construction, two-level logic minimization, and multilevel logic synthesis.

The operation of an embodiment of the method according to the present invention will now be described. The behavior of the computer in which the condition and the behavior corresponding thereto are described by the table format is converted into a functional structure having regular logic and their connecting relation by using the functional structure converting process by the logic designer, and the functional structure is converted into a logic structure which is expressed by the detailed Boolean expression by using the regular logic expanding process. In this instance, in the selector logic allocating process, a selector constructed by a positive logic and a selector constructed by a negative logic are virtually allocated to the selector logic and either one of the selectors in which the number of gates is small is selected. In the case where the internal signals are necessary during a fining process which details or specifies the functional structure into the logic structure, the internal signals are produced by the regular logic expanding process and the selector logic allocating process. For the logic structure which has been formed by the regular logic expanding process and has been expressed by the connecting structure of the Boolean expression, the redundancy portion is limited and detected by the redundancy logic detecting process. The redundancy is eliminated by the two-level logic construction, two-level logic minimization, and multilevel logic synthesis of the redundancy logic eliminating process. Thus, the multilevel logic which is expressed by the Boolean expression and which has no redundancy is obtained at a high speed. In this instance, the logic designer can also designate a redundant portion through the redundancy indicate file and can eliminate it.

BRIEF DESCRIPTION OF THE DRAWINGS

FIG. 1 is a diagram showing a construction of an automatic logic designing system;

FIGS. 2A and 2B are diagrams showing examples of control tables;

FIG. 4 is a diagram showing an example of a construction of a functional element table;

FIG. 5 is a diagram showing an example of a construction of an input signal table for functional structure;

FIG. 6 is a diagram showing an example of a construction of an output signal table for functional structure;

FIG. 9 is a diagram showing an example of a construction of a logic element table;

FIG. 10 is a diagram showing an example of a construction of an input signal table for logic structure;

FIG. 11 is a diagram showing an example of a construction of an output signal table for logic structure;

FIG. 13 is a diagram showing an example of an adjacent matrix;

FIG. 14 is a diagram showing a square matrix of the adjacent matrix;

DESCRIPTION OF THE PREFERRED EMBODIMENTS

Figure 3:
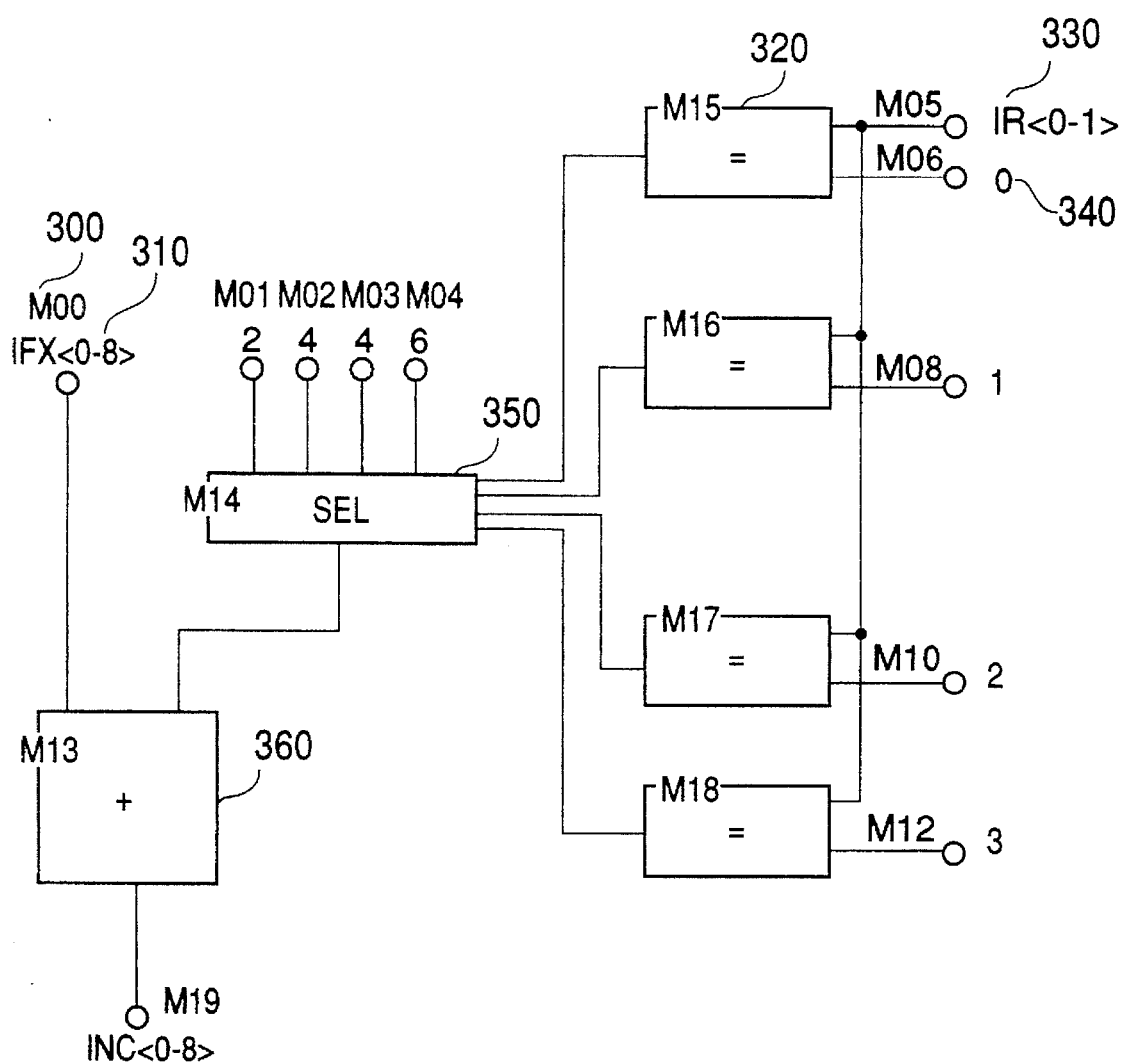
FIG. 3 is a diagram showing an example of a functional structure diagram.

An embodiment of the present invention will be described hereinbelow with reference to the drawings. As an input of the system, a control table is applied in which the set condition of a signal and the behavior of a logic circuit corresponding thereto are described in a table format with respect to the logic specification of a computer. In the embodiment, such a control table is inputted, a data structure of the logic circuit is formed, a logic circuit having a function expressed by the allocation of selector logics and the detailed Boolean expression is formed, and the elimination of redundancy logics and the addition of signal names are performed during the formation of such a logic circuit. When the redundancy logics cannot be eliminated by the above process, the redundancy logics are eliminated on the basis of the designation by the operator. Consequently, a logic circuit which is expressed by the Boolean expression and which has no redundancy is obtained.

FIG. 1 diagrammatically shows an example of a construction of an automatic logic designing system to embody the invention. An automatic logic designing system 105 receives a control table file 100 and executes the following processes and produces a detailed logic circuit expressed by a Boolean expression and supplies the logic circuit to a Boolean expression file 145. More specifically, the automatic logic designing system 105 shown in FIG. 1 is implemented by a computer system.

The outline of processes of the automatic logic designing system 105 will be first described hereinbelow with reference to FIG. 1. A functional structure converting (program) section 110 of a setting conditional equation of a signal and a behavioral equation of a logic circuit operates in the following manner. A conditional description column and a behavioral description column of the control table are discriminated. When subcolumns exist, a conditional description or a behavioral description is produced on the basis of the discrimination result of the subcolumn and a coupling rule between the subcolumns. The conditional description and the behavioral description described in the conditional description column and the behavioral description column are interpreted. On the basis of a design limit file 150 in which limit values of the number of gates and delay time which are limited in case of realizing the logic circuit have been stored, the conditional description and the behavioral description are converted into the circuit functional structure including regular logics whose functions have been determined in a macro manner and their connecting structure such as an adder, comparator, or the like to realize the function described in the control table. The result of the conversion is stored in a functional structure table 155.

A regular logic expanding processing section 115 allocates regular logics to expanded logics in the functional structure by using a regular logic file 160. The processing section 115 executes a regular logic expanding process 120 corresponding to the operator and subsequently performs a selector logic allocating process 125. Thus, the functional structure is converted into the logic structure, namely, the logic circuit expressed by the Boolean expression. The result of the conversion, namely, the logic structure which has been converted from the functional structure is stored into a logic structure table 165. Since there is a case where the logic structure includes a redundancy, the redundancy logic is eliminated by a redundancy logic elimination processing section 130. A redundancy eliminating process 140 included in the processing section 130 eliminates the redundancy logic detected by a redundancy detecting section 135 or the redundancy logic on the basis of a redundancy indicate file 170 in which the elimination logic designated by the user of the system has been stored. Finally, the logic circuit expressed by the Boolean expression including no redundancy is supplied to the Boolean expression file 145.

FIG. 2A diagrammatically shows an examples of a control table 100 as an input of the system. The control table 100 shows the input description of a table format having an IF conditional description 200 and a THEN behavioral description 210 and means that when the conditional equation described in the IF conditional description 200 is satisfied, the behavior described in the THEN behavioral description 210 is executed. FIGS. 2A and 2B show specific examples of the control table 100 where IR, INe, IFx, TA5, TA6, E, H and B denote the name of signals. In FIG. 2A, the conditional equation is described in the IF conditional description 200 by using the sign of equality and a transfer behavior or transfer operation is described in the THEN behavioral description 210.

Each of columns 240 and 250 in the control table 100 shown in FIG. 2B has a column 235 corresponding to the left side of the conditional equation and a column 245 corresponding to the right side, and a condition such that the value in the column 235 is equivalent to the value in the column 245 can be described. By providing the two columns 240 and 250, a condition such that both of the condition for a signal TA5 and the condition for a signal TA6 are simultaneously satisfied can be described. For example, the column 245 denotes a condition such that TA5=0 and TA6=1.

Each of columns 260 and 280 has a column 255 corresponding to the left side of the behavioral equation and a column 265 corresponding to the right side, and a transferring behavior of data from a variable shown by the column 265 to a variable shown by the column 255 can be described. By preparing a plurality of columns in the behavioral description column, a plurality of transferring behaviors can be simultaneously described.

In each of the control tables of FIGS. 2A and 2B, an arithmetic operator, a logical operator, or a relational operator can be described as an operator in each column. A signal name or a name of memory device such as a flip-flop, register, memory, or the like can be described as a variable. In the example of FIG. 2B, the conditions described in the two columns 240 and 250 are simultaneously satisfied. Namely, although an example of the control table constructing the conditions of the whole IF conditional description has been shown as a conjunction of each condition, a control table constructing the conditions of the whole IF conditional description can be also described as a disjunction of each condition. It is also possible to describe a control table by only the behavioral description without using any conditional description.

The description of the first row in FIG. 2A means that if IR<0–1> (220) is equal to 0, the behavior in which IFX<0–8> (231) and 2 (232) have been added is transferred to a corresponding behavior INC<0–8> (230). The first row in the column 245 in FIG. 2B denotes that when a signal TA5 (241) described in the conditional description is equal to 0 and a signal TA6 (251) is equal to 0, a signal H<0–1> (270) is transferred to a signal E<0–1> (261) and a signal H<2–3> (290) is transferred to a signal E<2–3> (281).

Figure 16:
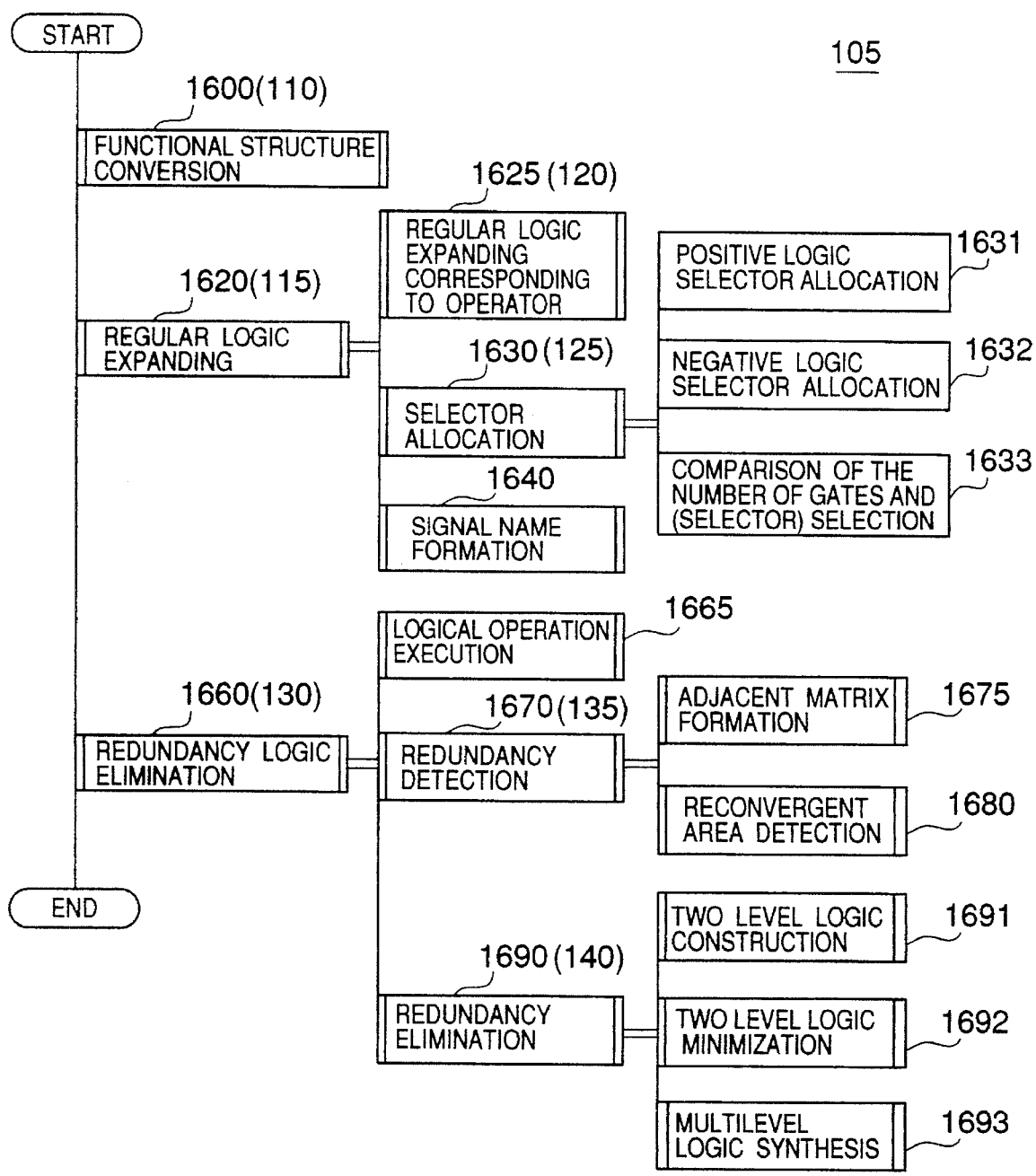
FIG. 16 is a diagram showing a processing procedure of the invention.

FIG. 16 diagrammatically shows a processing procedure of the automatic logic designing system 105 shown in FIG. 1. In FIG. 16, the process shown in corresponding FIG. 1 is shown by a numeral in ( ). A functional structure converting section 1600 in FIG. 16 corresponds to the functional structure converting section 110 of the conditional equation and behavioral equation shown in FIG. 1. A regular logic expanding section 1625 corresponding to the operator in a regular logic expanding section 1620 in FIG. 16 corresponds to the regular logic expanding section 120 corresponding to the operator in the regular logic expanding section 115 shown in FIG. 1. A selector allocating section 1630 in FIG. 16 corresponds to the selector logic allocating section 125 shown in FIG. 1. A redundancy detecting section 1670 in FIG. 16 corresponds to the redundancy detecting section 135 in the redundancy logic eliminating section 130 shown in FIG. 1. A redundancy eliminating section 1690 in FIG. 16 corresponds to the redundancy eliminating section 140 shown in FIG. 1. A processing procedure of the invention will now be described hereinbelow with reference to FIG. 16.

Figure 19:
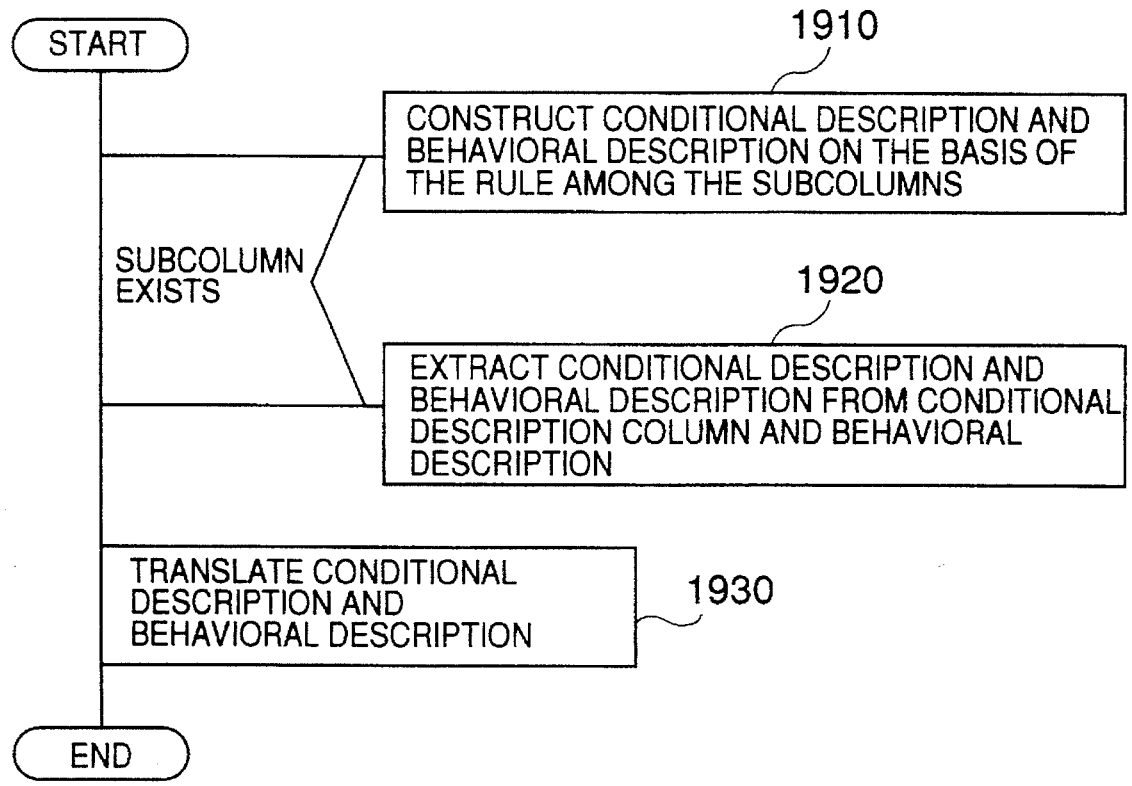
FIG. 19 is a diagram showing a procedure for a functional structure converting process.

When the control table 100 shown in FIG. 2 is inputted, the conditional equation and behavioral equation described respectively in the IF conditional description 200 and the THEN behavioral description 210 are analyzed by the functional structure converting section 1600. The control table 100 is converted into the functional structure shown in FIG. 3. In this instance, as shown in FIG. 19, the conditional description column and the behavioral description column in the control table are discriminated. The conditional description and the behavioral description are extracted (1920) and are translated (1930). In the case where the control table is divided into subcolumns, on the other hand, a conditional description or a behavioral description is constructed in accordance with the discrimination of the subcolumns and a rule which has been predetermined among the subcolumns (1910) and is translated (1930).

FIG. 3 illustrates an example showing a functional structure, which includes input/output signals and regular logics corresponding to the control table of FIG. 2A. In the functional structure converting section 1600, the regular logics are allocated so as to minimize the number of gates within a range which satisfies the delay time limit described in the design limit file 150. M00 (300) denotes a functional structure name of an input terminal and its specific input signal name is IFX<0–8> (310). A regular logic 320 indicates a comparator and has a function to generate a signal of "1" when the value of a signal IR<0–1> (330) is equal to 0 (340). A regular logic 350 is a selector. A regular logic 360 is an adder. The regular logic 320 having a function of the comparator is allocated to the equality sign "=" of the conditional equation IR<0–1>=0 in the control table shown in FIG. 2A. The regular logic 360 having a function of the adder is allocated to an operator + of the behavioral equation INC<0–8>=IFX<0–8>+2. Further, the correspondence between the IF conditional description and the THEN behavioral description in the control table is reflected to the regular logic 350 having a function of the selector. The functional structure shown in FIG. 3 is expressed by the functional structure table 155. The functional structure table 155 includes: a functional element table 155a shown in FIG. 4; an input signal table 155b for functional structure shown in FIG. 5; and an output signal table 155c for functional structure shown in FIG. 6.

The functional element table 155a shown in FIG. 4 includes: an item number 410; a functional element name 420 to store the name of each constructing element in the functional structure diagram; a function 430 to store the specific functional content; information 440 of a functional structure input signal table storing information regarding the input signal table (FIG. 5) for functional structure in which the input signals of the functional elements have been stored; and information 450 of a functional structure output signal table storing information regarding the output signal table (FIG. 6) for functional structure in which the output signals of the functional elements have been stored. Further, the input signal table information 440 for functional structure includes: a pointer 443 to store pointer to the input signal table for functional structure; and the number of entries (446) to store the number of entries. The output signal table information 450 for functional structure includes: a pointer 453 to store a pointer to the output signal table for functional structure; and the number of entries (456) to store the number of entries. The functional element table 155a shown in FIG. 4 is a table in which data indicative of the logic of the functional structure diagram shown in FIG. 3 has been stored. For instance, M00 (300) in FIG. 3 is stored as a functional element name in the entry of the item No. 1, and "input" is stored in the function 430.

The input signal table 155b for functional structure shown in FIG. 5 is a table in which information regarding the input signals of the functional elements has been stored and includes: an item number 500; an input signal name 510 for functional structure to store the names of signals which are inputted to the functional elements in the functional structure diagram; and a pointer 520 to the functional element table 155a shown in FIG. 4.

The output signal table 155c for functional structure shown in FIG. 6 is a table in which information regarding the output signals of the functional elements has been stored and includes: an item number 600; an output signal name 610 for functional structure to store the names of signals which are outputted from the functional elements in the functional structure; and a pointer 620 to the functional element table 155a shown in FIG. 4.

The connecting relation of the functional structure diagram shown in FIG. 3 can be expressed by the functional element table 155a shown in FIG. 4, the input signal table 155b for functional structure shown in FIG. 5, and the output signal table 155c for functional structure shown in FIG. 6. For example, an entry of the item No. 14 in FIG. 4 is set to a functional element name M13 and its function is set to + (adder). The information regarding the input signal to the adder has been stored in two entries shown by the number of entries (446) from the entry of the value 14 shown by the pointer 443 in the input signal table 155b for functional structure. The name of input signal for functional structure of the first entry, namely, the entry of the item No. 14 in the input signal table 155b for functional structure shown in FIG. 5 is set to M00S. Further, information indicating that such a signal is an output signal from which one of the functional elements is designated by the functional element table pointer 520 of the item No. 14 and it will be understood that its value is equal to "1", that is, the signal is outputted from the functional element of the entry of the item No. 1 in the functional element table. Similarly, the input signal name 510 for functional structure of the second entry, namely, the entry of the item No. 15 in the input signal table 155b for functional structure shown in FIG. 5 is set to M14S. Further, information indicating that such a signal is an output signal from which functional element is designated by the functional element table pointer 520 of the item No. 15 and it will be understood that its value is equal to "15", namely, the signal is outputted from the functional element of the entry of the item No. 15 in the functional element table. The above connecting relation corresponds to the functional structure diagram of FIG. 3.

Figure 8:
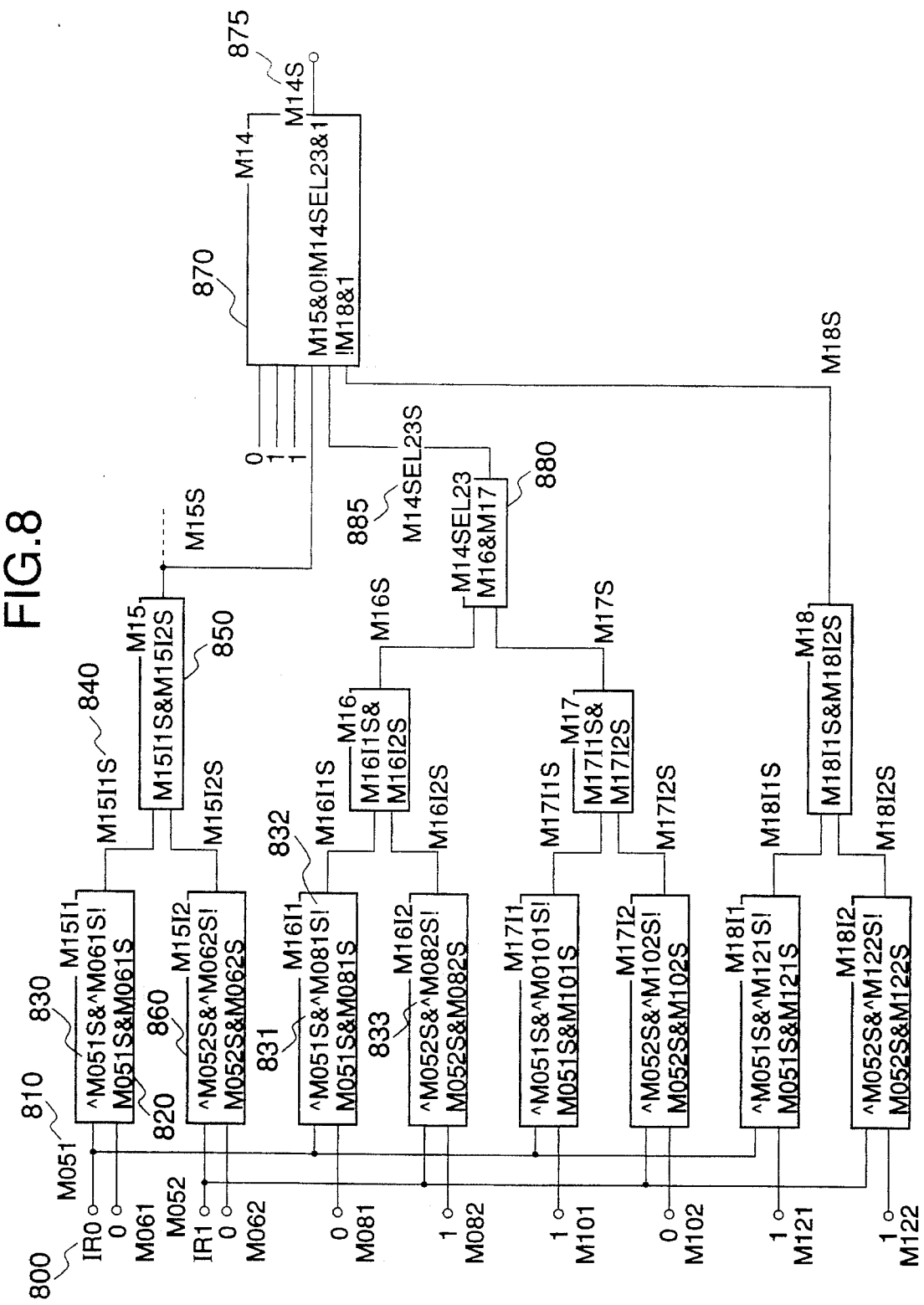
FIG. 8 is a diagram showing an example of a logic structure diagram.

After completion of the process of the functional structure converting section 1600, a regular logic expanding, section 1620 shown in FIG. 16 illustrating several program execution processes is executed. The regular logic expanding section 1620 includes: an operator-related regular logic expanding process 1625; a selector allocation process 1630; and a signal name formation process 1640. In the operator corresponding regular logic expanding process 1625, for example, a logic structure expressed by the Boolean expression to practically realize the function of a comparator is allocated to the regular logic 320 having a function of the comparator included in the functional structure diagram shown in FIG. 3. FIG. 8 shows a result in the case where the logic structure has been allocated to the functional structure diagram shown in FIG. 3. The functional element 320 is converted into logic elements 820, 850, and 860. Similarly, the functional element 350 included in the functional structure diagram shown in FIG. 3 is converted into logical elements 870 and 880. The logic structure shown in FIG. 8 is expanded into the logic structure table 165 which includes: a logical element table 165a shown in FIG. 9; an input signal table 165b for logic structure shown in FIG. 10; and an output signal table 165c for logic structure shown in FIG. 11.

In FIG. 8, "&" 831 denotes a conjunction, "!" 832 denotes a disjunction, and "^" 833 denotes a negation. A logic element name M051 (810) denotes an input signal and its name is set to IR0 (800). This signal is inputted to the logic element 820. The logic element 820 constructs a function by a Boolean expression 830 and generates an output signal M1511S (840).

FIG. 9 diagrammatically shows an example of a construction of the logic element table 165a. The logic element table 165a includes: an item number 910; a logic element name 920 to store the name of each constructing element in the logic structure diagram; a logic element function 930 to store the specific functional content in a form of Boolean expression; input signal table information 940 for logic structure in which information regarding the input signal table (FIG. 10) for logic structure in which the input signals of the logic elements had been stored has been stored; output signal table information 950 for logic structure in which information regarding the output signal table (FIG. 11) for logic structure in which the output signals of the logic elements had been stored has been stored; and a redundancy flag 960 indicating whether the logic element is redundant or not. Each field in FIG. 9 corresponds to each field in the functional element table 155a shown in FIG. 4 except a redundancy flag.

The input signal table information 940 for logic structure includes: a printer 943 to store a pointer to the input signal table 165b for logic structure shown in FIG. 10; and the number of entries (946) to store the number of entries. The output signal table information 950 for logic structure includes: a pointer 953 to store a pointer to the output signal table 165c for logic structure shown in FIG. 11; and the number of entries (956) to store the number of entries. FIG. 9 expresses the logic of the logic structure diagram shown in FIG. 8 by the data in a table format. M051 (810) is stored as a logic element name into the entry of the item No. 1, and "input" indicating that the logic element relates to the input signal is stored into the logic element function 930.

FIG. 10 diagrammatically shows an example of a construction of the input signal table 165b for logic structure. The input signal table 165b for logic structure includes: an item number 1000; an input signal name 1010 for logic structure to store the names of signals which are inputted to the logic elements in the logic structure diagram shown in FIG. 8; and a pointer 1020 to the logic element table 165a shown in FIG. 9.

FIG. 11 is a diagram showing an example of the output signal table 165c for logic structure. The output signal table 165c for logic structure includes: an item number 110; an output signal name 1110 for logic structure to store the names of signals which are outputted from the logic elements in the logic structure diagram shown in FIG. 8; and a pointer 1120 to the logic element table 165a shown in FIG. 9.

A connecting relation of the logic structure diagram (FIG. 8) can be expressed by the logic element table (FIG. 9), input signal table for logic structure (FIG. 10), and output signal table for logic structure (FIG. 11). For example, the entry of the item No. 4 in FIG. 9 relates to a logic element name M1511. Information regarding the input signal to the logic element has been stored in two entries of the number of entries from the fourth entry indicated by the pointer 943 in the input signal table for logic structure. The input signal name 1010 for logic structure of the first entry, namely, the entry of the item No. 4 in the input signal table 165b for logic structure is set to M051S. Further, information indicating that such a signal is an output signal from which logic element is designated by the logic element table pointer 1020 of the item No. 4, and it will be understood that its value is equal to "1", namely, the signal has been outputted from the logic element of the entry of the item No. 1 in the logic element table 165a. Similarly, the input signal name 1010 for logic structure of the second entry, namely, the entry of the item No. 5 in the input signal table 165b for logic structure is set to M061S. Further, information indicating that the signal is an output signal from which logic element is designated by the logic element table pointer of the item No. 5, and it will be understood that its value is equal to "3", namely, the signal has been outputted from the logic element of the entry of the item No. 3 in the logic element table. The above connecting relation corresponds to the logic structure diagram of FIG. 8.

There is a case where an internal signal is generated during the process for converting a functional structure into a logic structure. Such a case is shown in, for example, M14SEL23S or the like in FIG. 8. In this case, a signal name is formed by synthesizing a functional element name M14 to the internal signal name SEL23S which has been prepared in a regular logic file 160 by the signal name formation process 1640. The signal name is stored into the input signal name 1010 for logic structure in the input signal table 165b for logic structure and into the output signal name 1110 for logic structure in the output signal table 165c for logic structure, respectively.

Figure 17:
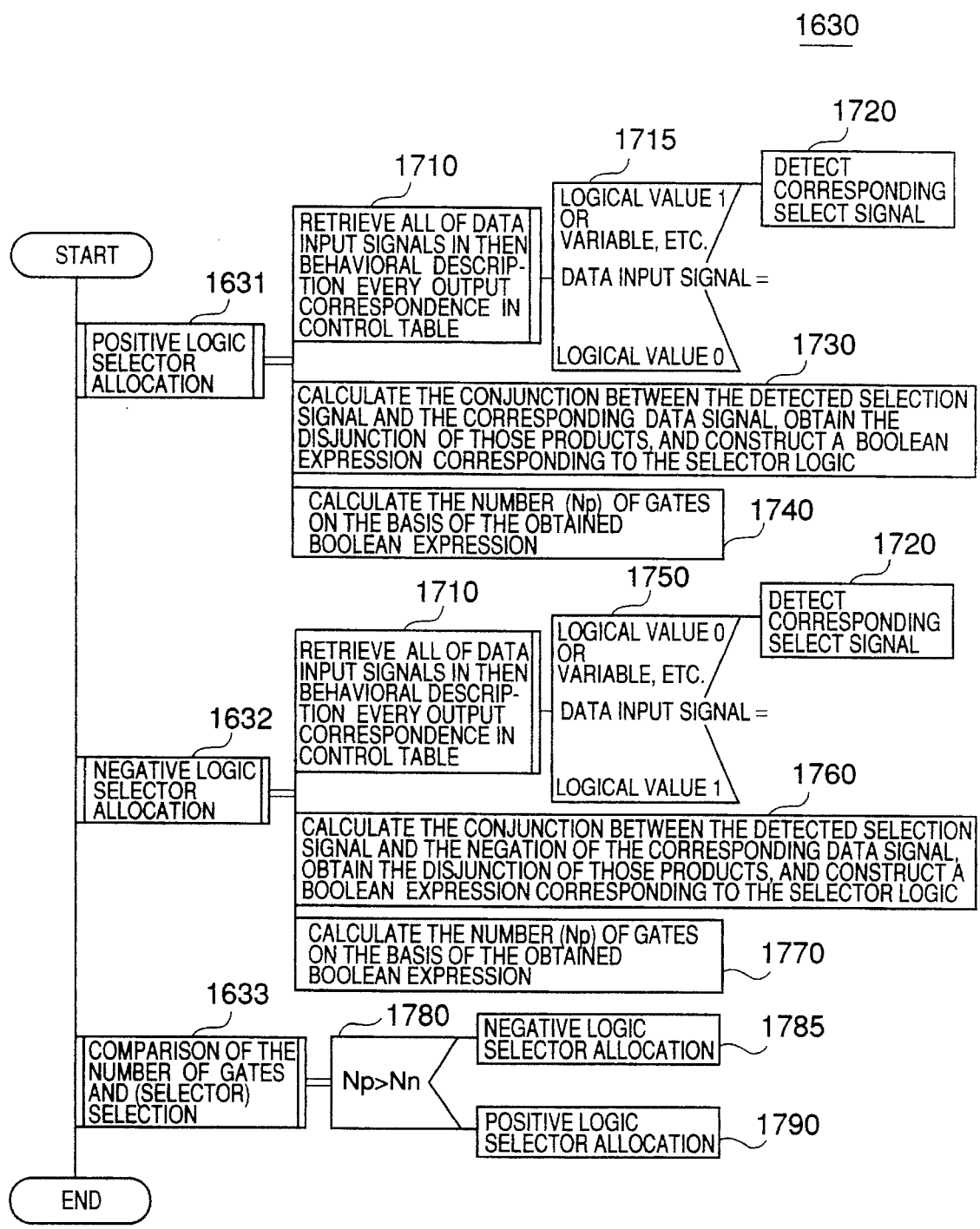
FIG. 17 is a diagram showing a selector allocation processing procedure.

The selector allocating process 1630 shown in FIG. 16 executes a positive logic selector allocating process 1631 and a negative logic selector allocating process 1632 and performs a process 1633 for judging which one of those processes has a smaller number of gates and selecting one of the allocation results. FIG. 17 shows the details of the selector allocating process 1630.

First, in the positive selector allocating process 1631 retrieves all of the data input signals included in the THEN behavioral description every output signal in the control table 100 (1710). When each data input signal is equal to a logic value of "1" or a variable or another behavioral equation (1715), the selecting condition corresponding to the data signal is selected from the IF conditional description column (1720). Subsequently, the selected selecting condition is converted into the Boolean expression, the conjunction between the Boolean expression and the data signal is obtained, the conjunction between the selecting condition and the data signal is calculated, and the disjunction for the conjunctions which are obtained from the whole control table is calculated, thereby forming a Boolean expression to express a selector logic (1730). Namely, in the process 1730, the conjunction between the detected selection signal and the data signal corresponding thereto is calculated and the disjunction of only those selected portions is obtained, thereby constructing a Boolean expression corresponding to the selector logic every output signal. On the basis of the Boolean expression obtained, the number of gates is calculated and its value is stored into a holding area of a variable $N_p$ (1740).

The process of the negative logic selector allocation process 1632 is also similar to the positive logic selector allocation process 1631. In the retrieval of the data signal (1710), however, the data signal in case of the logic value of "0" is retrieved (1750) in a manner opposite to the case of the positive logic and the selecting condition corresponding to it is selected from the IF conditional description column. Further, a Boolean expression corresponding to the selector logic is constructed by the negation between the Boolean expression corresponding to the selected selecting condition and the data signal (1760). Namely, in the process 1760, the conjunction between the detected selection signal and the negation of the data signal corresponding thereto is calculated and the disjunction of only the selected portions is obtained, thereby constructing a Boolean expression corresponding to the selector logic every output signal. On the basis of the Boolean expression obtained, the number of gates is calculated and its value is stored into a holding area of a variable $N_n$ (1770).

Finally, when a condition 1780 such that $N_p > N_n$ is satisfied in the gate number comparison/selection process 1633, the negative logic selector allocation process is executed (1785). When the condition 1780 is not satisfied, the positive logic selector allocation process is executed (1790).

Figure 7A:
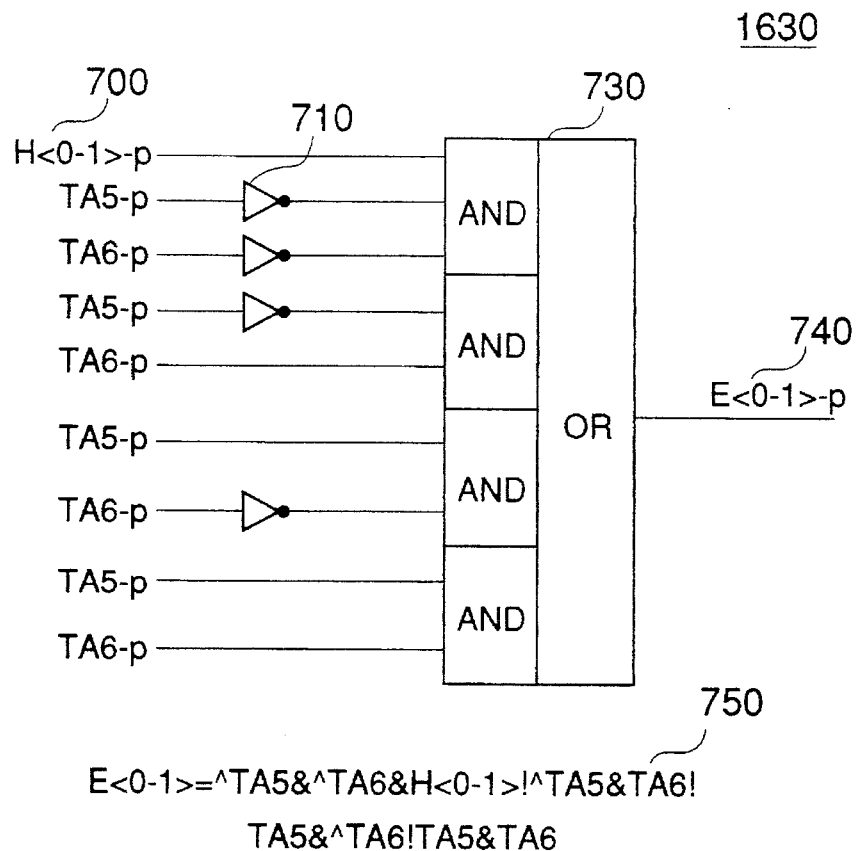
FIGS. 7A and 7B are diagrams showing examples of the logic development and selector logic allocation in FIG. 2B, respectively.

FIG. 7 shows the results in which the selector logics of the positive logic and negative logic have been allocated for the example of the output signal E<0–1> (261) in the control table 100 shown in FIG. 2B by using a processing procedure shown in FIG. 17. FIG. 7A shows the selector logic in the case where it has been allocated by the positive logic. In FIG. 7A, a suffix -p of an input signal H<0–1>$_p$ (700) denotes a positive logic and indicates that the signal is inputted as a positive logic. The selected logic is expressed by a Boolean expression 750. In the Boolean expression 750, since the signal TA5 has the positive logic, an inverter 710 is inserted into the logic circuit for a negation operator ^ written just before TA5.

Figure 7B:
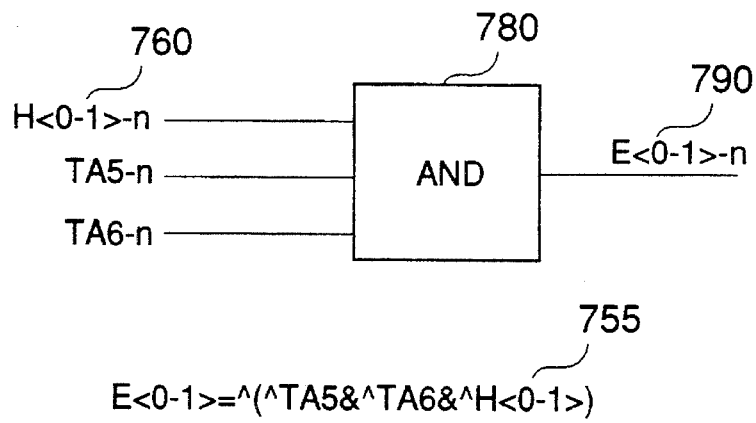

FIG. 7B shows the case where the logic equivalent to FIG. 7A has been allocated as a negative logic. A suffix -n in an input signal H<0–1>$_{-n}$ (760) denotes a negative logic and indicates that the signal is inputted by the negative logic. The selected result is outputted as a negative logic to an output terminal E<0–1>$_{-n}$ (790). Such a logic is expressed by a Boolean expression 755. In the Boolean expression 755, since the signal TA5 has a negative logic, no inverter is inserted to the negation operator ^ written just before TA5.

In the embodiment shown in FIGS. 7A and 7B, in case of constructing a selector by using the positive logic, a selector 730 is constructed by total five gates including four AND and one OR. In case of constructing a selector by the negative logic, a selector 780 is constructed by one AND gate. Therefore, the negative logic selector 780 using a small number of gates is selected. In the Boolean expressions 750 and 755, "&" denotes a conjunction logical product, "!" indicates a disjunction (logical sum), and "^" shows a negation, respectively.

A redundancy logic eliminating process 1660 shown in FIG. 16 is subsequently executed. First, in the above logic structure, a Boolean expression of the logic element into which a constant is inputted is modified into a simpler Boolean expression by logical operations in a logical operation executing process 1665. In the logic circuit in the logic structure diagram shown in FIG. 8, as shown in a logic structure diagram of FIG. 12, redundancy detection is executed to a part of the result of the execution of the logical operations. The logical operations are executed in accordance with the following well-known rules.

(1) a!1=1
(2) a!0=a
(3) a&1=a
(4) a&0=0
(5) ^ 0=1
(6) ^ i=0

Figure 12:
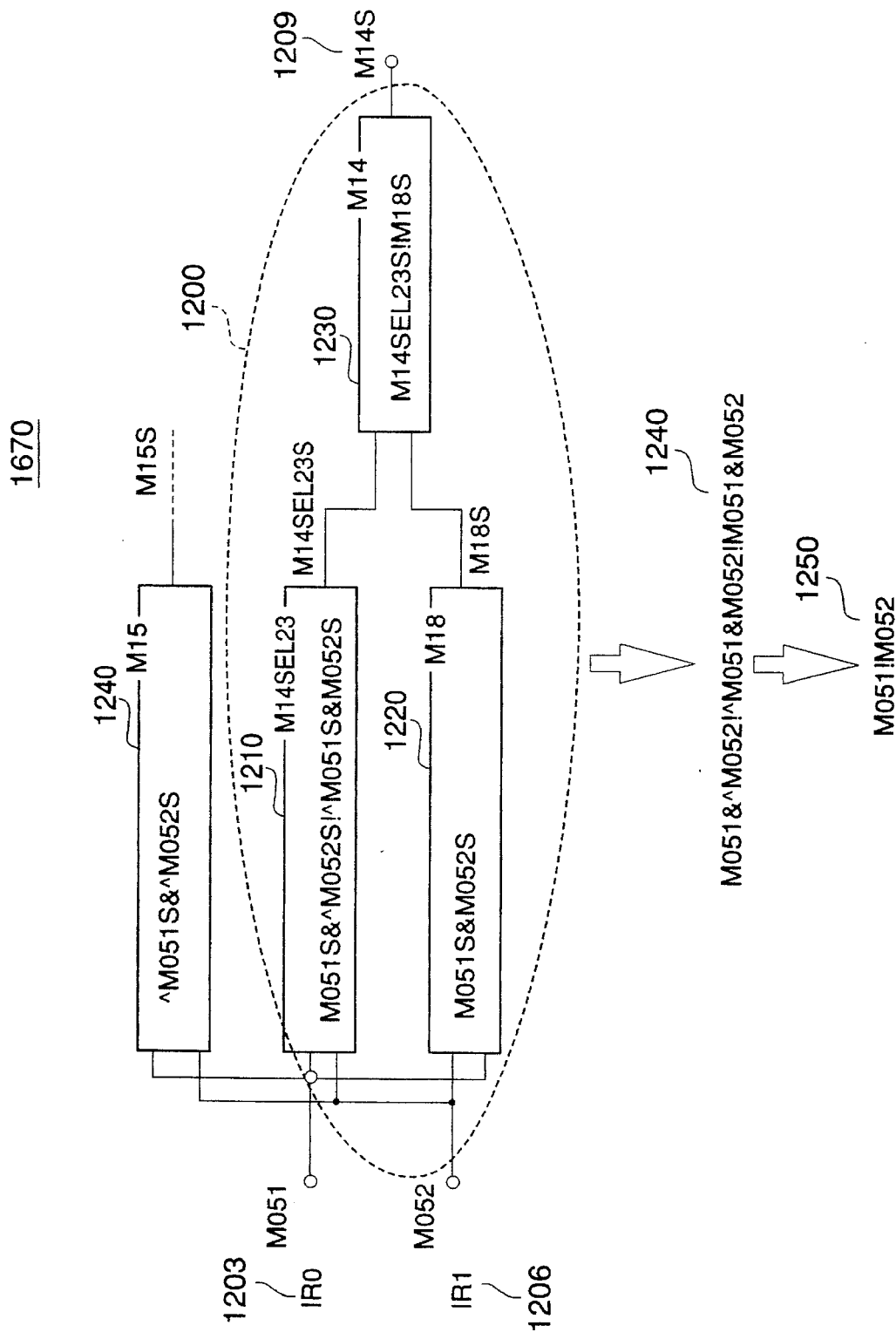
FIG. 12 is a diagram showing an example of the redundancy detection.

In FIG. 12, a portion of the logic circuit surrounded by an ellipse 1200 as shown is called a reconvergent area because a signal IR0 (1203) and a signal IR1 (1206) are branched and are reconverged at a signal M14S (1209). Constants are inputted for all of logic elements 1210, 1220, and 1230 and are converted into the Boolean expression different from the original Boolean expression allocated by the regular logic expanding process 1620. By expanding those logic elements into a sum-of-product form Boolean expression 1240 in a lump, the Boolean expression is simplified like a Boolean expression 1250. Such a redundancy detection for the reconvergent area as a target is executed by a redundancy detection process 1670 shown in FIG. 16.

Figure 18:
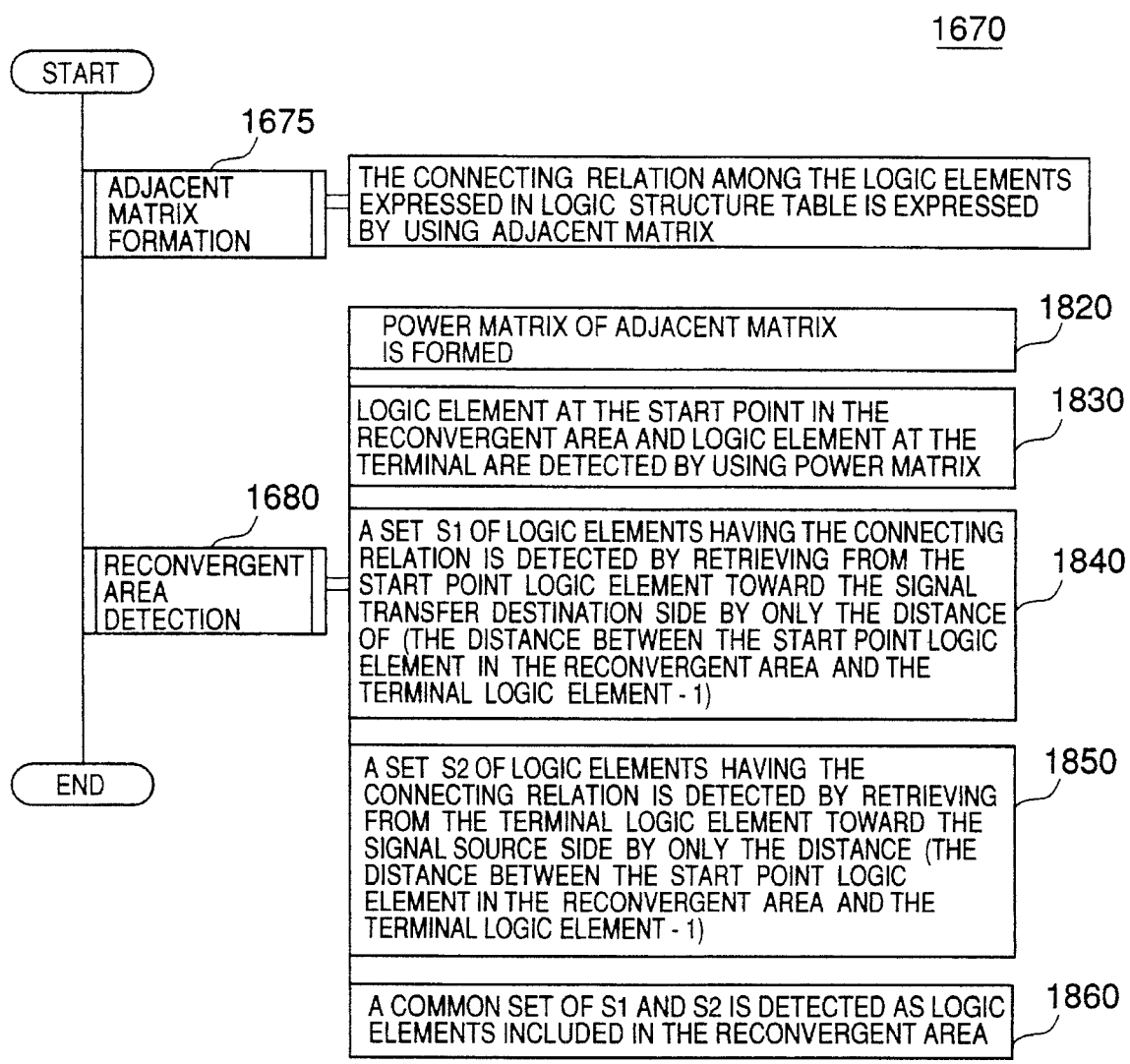
FIG. 18 is a diagram showing a redundancy detection processing procedure.

A detailed processing procedure of the redundancy detecting process 1670 will now be described with reference to FIG. 18. First, in an adjacent matrix forming process 1675, an adjacent matrix shown in FIG. 13 is formed from the connecting relation among the logic elements expressed in the logic structure table 165. The embodiment of the adjacent matrix shown in FIG. 13 expresses the connecting relation among the logic elements included in the logic structure diagram of FIG. 12. A row direction 1300 corresponds to the logic elements on the signal source side. A column direction 1310 corresponds to the logic elements on the signal transfer destination side. "0" is set into blank 1320 among the elements of the matrix. This means that the connecting relation from the logic elements in the row direction to the logic elements in the column direction exists. In the case where "1" has been set in the elements of the matrix (1330), this means that the connecting relation from the logic elements in the row direction to the logic elements in the column direction exists. For example, this means that a connecting relation from the row direction to the logic element in the column direction exists. For instance, this means that a connecting relation exists from a logic element M14SEL23 (1340) to the logic element M14 (1350).

The reconvergent area 1200 shown in FIG. 12 is subsequently detected by a reconvergent area detecting process 1680. More specifically, a square matrix shown in FIG. 14 is obtained from the adjacent matrix shown in FIG. 13 by a process 1820 to form a power matrix of the adjacent matrix. A logic element at a starting point of the reconvergent area and a logic element at a terminal (end point) are now detected from the power matrix shown in FIG. 14 (1830). The value of each element included in the square result of the adjacent matrix shown in FIG. 14 indicates the number of signal paths which pass through one logic element and reach another logic element. For instance, a numerical value 2 of an element 1400 indicates that there are two signal paths which reach the logic element M14 from a logic element M052. Actually, two signal paths which reach M14 from M51 exist in FIG. 12.

On the basis of the above result, the logic element serving as a start point of the reconvergent area and the logic element serving as a terminal are detected by using the power adjacent matrix shown in FIG. 14. In the square matrix of the adjacent matrix in FIG. 14, the logic element M052 of the column (signal source) corresponding to the element 1400 having a value "2" is obtained as a start point logic element and the logic element M14 of the row (signal transfer destination) is obtained as a terminal logic element.

In a process 1840, a set S1 of logic elements having the connecting relation is detected by retrieving from the start point logic element toward the signal transfer destination side by only a distance of (the distance between the starting point logic element in the reconvergent area and the terminal logic element—1). The distance defined here is equal to the value indicative of a nearness between the logic elements in the logic structure. Particularly, the distance between the adjacent logic elements is set to 1. For instance, the distance between the logic elements which are connected via one logic element is equal to 2. In the above retrieval, the adjacent matrix shown in FIG. 13 is used. Thus, {M15 (1240), M14SEL23 (1210), M18 (1220)} is obtained as a set S1 in the reconvergent area 1200 shown in FIG. 12.

In a process 1850, a set S2 of logic elements having the connecting relation is detected by retrieving from the terminal logic element toward the signal source side by only a distance of (the distance between the start point logic element in the reconvergent area and the terminal logic element—1). In the above retrieval, the adjacent matrix shown in FIG. 13 is used. Thus, {M14SEL23 (1210), M18 (1220)} is obtained as a set S2 in the reconvergent area 1200 shown in FIG. 12.

Finally, a common set of the sets S1 and S2 is obtained (1860). In the embodiment shown in FIG. 12, {M14SEL23 (1210), M18 (1220)} is obtained as a common set. The logic elements included in the detected common set and the start point logic element and terminal logic element in the reconvergent area are all redundancy logic elements. For those logic element, "1" is set in the column of the redundancy flag 960 in the logic element table shown in FIG. 9.

The logic designer can instruct the redundancy logics through the logic indicate file 170. For the designated logic elements, "1" is set into the column of the redundancy flag 960 in the logic element table in a manner similar to the automatic detection.

Figure 15:
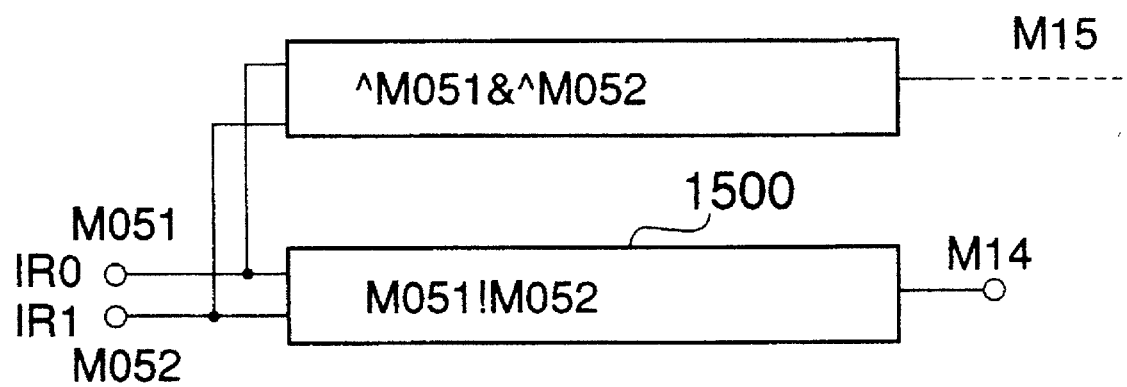
FIG. 15 is a diagram showing a result of the redundancy elimination.

As a result of the above redundancy detecting process, a redundancy eliminating process 1690 is executed to the redundancy logic elements in the logic element table shown in FIG. 9 in which "1" has been set in the redundancy flag 960. In the redundancy eliminating process 1690, a two-level logic construction process 1691, a two-level logic minimization process 1692, a multi-level logic synthesis process 1693 are executed. The two-dimensional logic construction process 1691 is a process to convert the multilevel logic into the two-level logic. The two-level logic minimization process 1692 is a process to eliminate the redundant logics from the two-level logics as a target. The above process has been described in detail in, for example, "Logic Minimization Algorithm for VSLI Synthesis", Kluwer Academic Publishers, Boston, 1984, and Rudell et al., "Multiple-Valued Minimization for PLA Optimization", in IEEE Transaction on Computer-aided Design, Vol. CAD-6, No. 5, pages 727 to 750, September, 1987. The multilevel logic synthesis process 1693 is a process to convert the two-level logic having no redundancy into the multilevel logic. Such a process has been disclosed in detail in Socrates, "A System for Automatically Synthesizing and Optimizing Combinational Logic", The Design Automation Conference 86, pages 79 to 85. Thus, the result of the elimination of the redundancy is obtained. For the redundancy logic circuit of the reconvergent area 1200 detected by the redundancy detecting section shown in FIG. 12, a logic element 1500 shown in FIG. 15 is a target for elimination of the redundancy. As a result of using the redundancy eliminating process 1690, the number of gates is reduced from five to two.

By inputting the control table which can describe the conditions which often appear in the specification of the logic design of the digital computer and the behaviors corresponding to those conditions by a table format, complicated behaviors can be easily described without an error as compared with the case of describing them by a program language format. On the other hand, by allocating the logic circuit in consideration of the positive logic and negative logic for the selector logic, a logic circuit using a small number of gates can be obtained as compared with the case of considering on a gate unit basis. The logic circuit can be easily understood on the logic drawing by the forming method of the signal names. The redundancy logics which partially occur in the logic circuit are limited by the redundancy detecting process or by an instruction of the logic designer, so that the redundancy logics can be eliminated at a higher speed as compared with the case of handling the logic circuits in a lump.

What is claimed is:

1. A method of designing a logic circuit using a computer comprising the steps of:

a) inputting in the form of a table for hardware implementation a description of logic specification in which a setting condition of a signal and a behavior of the logic circuit are described in a corresponding relation to each other as a behavioral specification of the logic circuit each being composed of at least one equation described by combining at least one type of a constant, a variable, a logical operator, a relational operator and an arithmetic operator said behavior of the logic circuit which is executed when said signal setting condition is satisfied;

b) forming a Boolean expression corresponding to a selector for selecting an output of a logic circuit constructing said behavior description as a data signal on the basis of a selection signal which is generated from a logic circuit corresponding to the equation constructing said setting condition description when said signal setting condition is satisfied;

c) registering said condition and said relational operator and/or arithmetic operator as described in said condition and said behavior into a library which has previously been prepared and allocating a regular logic circuit corresponding to a function of the operator expressed by a Boolean expression; and d) detecting and eliminating a redundancy logic included in the logic circuit whose function is expressed by the Boolean expression and which includes the selector and the regular logic circuit.

2. A method according to claim 1, wherein said Boolean expression forming step b) includes steps of:

constructing said selector from said table by a positive logic for making a high potential state of a signal line correspond to a truth value;

constructing the selector from said table by a negative logic for making a low potential state of the signal line correspond to a truth value; and deciding either one of said selectors having a smaller number of gates and allocating the decided selector to the logic circuit.

3. A method according to claim 1, wherein in said regular logic circuit allocating step c), a general signal name which has previously been prepared in the regular logic circuit and information regarding said relational operator or said arithmetic operator are combined, thereby forming an internal signal name.

4. A method according to claim 1, wherein said redundancy logic detecting and eliminating step d) includes a step of executing a logical operation of the Boolean equation by using a predetermined logical value of a signal in the case where said signal having said predetermined value is inputted to the logic circuit and eliminating the redundancy logic included in said logic circuit.

5. A method according to claim 1, wherein said redundancy logic detecting and eliminating step d) includes a step of detecting a partial logic circuit in which a signal path is branched in the logic circuit and the branched signal paths are again joined and eliminating the redundancy logic of said partial logic circuit.

6. A method according to claim 5, wherein in said step of detecting the partial logic circuit in which a signal path in said logic circuit is divided into branched signal paths and the branched signal paths are again joined, comprising:
   referring to a logic structure table to store constructing data of said logic circuit expressed by a Boolean expression;
   generating an adjacent matrix of logic elements of a signal source and logic elements on a signal transferring side on the basis of a connecting relation among the logic elements expressed in said table,
   generating a power matrix of said adjacent matrix; and
   determining redundant logic elements to be eliminated from a detected reconvergent area on the basis of said power matrix formed.

7. A method according to claim 1, wherein said redundancy logic detecting and eliminating step d) includes a step of instructing a partial logic circuit included in the logic circuit by the user and eliminating the redundancy logic on the basis of said instruction.

8. A method of designing a logic, comprising the steps of:
   inputting a table for hardware implementation in which a description of a setting condition of a signal and a description of a behavior of a logic circuit which is executed when said condition is satisfied each description including at least one equation composed of combination of at least one of a constant, a variable, a logical operator, a relational operator and an arithmetic operator and being described as a specification of the logic circuit are stored in a corresponding relation to each other;
   discriminating the setting condition and the behavioral description for the signal in said table, respectively;
   translating said setting condition and said behavioral description of the logic circuit discriminated by said discriminating step into an internal expression in the form of a language; and
   forming a logic circuit corresponding to said translated language by compiling.

9. A method according to claim 8, wherein in said table, a description column of said condition and a description column of said behavior are divided into a plurality of subcolumns, the conditions and behaviors described in said subcolumns are coupled in accordance with a predetermined rule, and a description format of the condition and behavior is constructed.

10. A method according to claim 9, wherein said table formed is inputted, each of the subcolumns of said inputted table and the rule among the subcolumns is discriminated, the setting condition of the signal which is obtained as a result of said discrimination and the behavioral description of the logic circuit are translated into the internal expression, and the logic circuit corresponding to the translated internal expression is formed.

11. A method according to claim 8, wherein a format in which the description of the setting condition of the signal and the description of the behavior of the logic circuit which is executed when said condition is satisfied have been made correspond to each other is displayed on a display screen, thereby enabling the user to visibly input a data to a relevant item of said displayed format.

12. A logic design system for interactively designing a logic circuit using a computer, comprising:
   file means for storing a table for hardware implementation in which a description of a setting condition of a signal and a description of a behavior of a logic circuit which is expressed by at least one equation and is executed when said condition is satisfied are made as a specification description of said logic circuit in a corresponding relation to each other, each description including at least one equation composed of combination of at least one of a constant, a variable, a logical operator, a relational operator and an arithmetic operator; and
   a processor coupled to receive said table from said file means into a work area, for executing a plurality of processes,
   wherein said processor comprises discriminating means for discriminating the description of the setting condition of the signal and said behavioral description for said table in accordance with a processing program;
   translating means for translating the description of the setting condition and the behavioral description of the logic circuit into an internal expression; and
   generating means for generating a logic circuit on design corresponding to the internal expression translated by said translating means.

13. A system according to claim 12, further including table forming means for interactively forming said table,
   wherein said table forming means includes a resource of a table format having a description column of the setting condition of the signal and the description column of the behavior of the corresponding logic circuit, a display apparatus to display said format, and an input device to describe into said display format, and a table is formed by said description input.

* * * * *